United States Patent
Inoue et al.

(10) Patent No.: US 6,285,782 B1
(45) Date of Patent: Sep. 4, 2001

(54) MOUNTING APPARATUS, RECOGNITION DEVICE AND RECOGNITION METHOD FOR ELECTRONIC COMPONENT

(75) Inventors: Masafumi Inoue, Saga; Hideaki Kato, Fukuoka, both of (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/350,707

(22) Filed: Jul. 9, 1999

(30) Foreign Application Priority Data

Jul. 10, 1998 (JP) .................................... 10-195384

(51) Int. Cl.$^7$ ........................................ G06K 9/20
(52) U.S. Cl. ............................................. 382/145
(58) Field of Search ................... 382/145, 146, 382/151, 291, 312, 318, 319; 348/87, 94, 95, 126; 356/375, 400, 237.4, 237.5, 613, 614, 638, 392, 432, 433; 250/559.3, 559.34; 702/150–153; 438/16

(56) References Cited

U.S. PATENT DOCUMENTS

| | | | |
|---|---|---|---|
| 4,628,464 | * 12/1986 | McConnell | 364/513 |
| 4,867,569 | * 9/1989 | Mohara | 356/375 |
| 4,951,383 | * 8/1990 | Amao et al. | 29/721 |
| 5,012,115 | * 4/1991 | Asai et al. | 250/561 |
| 5,131,139 | * 7/1992 | Oyama et al. | 29/721 |
| 5,214,841 | * 6/1993 | Howard et al. | 29/721 |
| 5,461,480 | * 10/1995 | Yamada et al. | 356/394 |
| 5,646,681 | * 7/1997 | Okazaki | 348/87 |
| 5,999,640 | * 12/1999 | Hatase et al. | 382/151 |
| 6,100,922 | * 8/2000 | Honda et al. | 348/86 |
| 6,160,906 | * 12/2000 | Lehnen et al. | 382/145 |

* cited by examiner

Primary Examiner—Leo Boudreau
Assistant Examiner—Brian P. Werner
(74) Attorney, Agent, or Firm—Ratner & Prestia

(57) ABSTRACT

An electronic component mounting apparatus, an electronic component recognition device and an electronic component recognition method are provided which enable accurate recognition for correcting deviations in alignment of an electronic component in relation to its mounting position. An electronic component being held by a mounting head is illuminated, and a camera visually recognizes the electronic component. A light reflector disposed on a bottom face of the mounting head has a reflector for totally reflecting light, an illuminating body disposed on the reflector which illuminates by absorbing light from a first light source, and a selectively transmitting body disposed on the illuminating body which transmits light from the first light source and absorbs light from a second light source. This configuration causes the light entering the camera from the light reflector to be even. Two lighting methods, i.e. transillumination and illumination provided by reflection, are selectively used by switching the first and second light sources to select the kind of light.

3 Claims, 7 Drawing Sheets

MOUNTING APPARATUS, RECOGNITION DEVICE AND RECOGNITION METHOD FOR ELECTRONIC COMPONENT

FIELD OF THE INVENTION

The present invention relates to an electronic component mounting apparatus, an electronic component recognition device and an electronic component recognition method, through which electronic components can be recognized as an image when mounting them onto a substrate

BACKGROUND OF THE INVENTION

Electronic component mounting apparatuses for mounting electronic components on a substrate, generally use an image recognition method to correct deviations in alignment of the electronic component in relation to its mounting position, in order to improve the accuracy of the electronic component mounting. In this method, a mounting head picks up an electronic component from a component feeder. A camera captures an image of the electronic component while it is being held by the mounting head. The captured image is visually processed to detect deviations in alignment of the electronic component in relation to the correct mounting position. When mounting the electronic component on a substrate, misalignment is corrected, and the position of the electronic component is determined correctly and accurately before the electronic component is mounted.

As a lighting method for the image recognition device which recognizes the electronic component by capturing an image, the following method is generally used. Conventionally, light is projected to a light diffuser panel employed behind an electronic component. A camera captures the light irregularly reflected from the light diffuser panel. In this method, the electronic component is located by a transmission recognition whereby the electronic component is recognized as a dark image.

The above-mentioned conventional lightening method, however, has had the following problems. Firstly, the amount of light radiated from behind the electronic component to the camera is small due to the incidence direction of the light from the light source and the nature of the light diffuser panel. Secondly, the light is not radiated evenly. This lack of light quantity and uneven radiation results in reduced accuracy in recognizing the electronic component.

The present invention aims at providing an electronic component mounting apparatus, an electronic component recognition device and an electronic component recognition method for an accurate recognition to correct misalignment in positioning of the electronic component.

SUMMARY OF THE INVENTION

The electronic component mounting apparatus of this invention comprises the following elements:
1) a mounting head;
2) a nozzle provided to the mounting head for holding the electronic component;
3) a first light source for radiating light of a first wavelength;
4) a second light source for radiating light of a different wavelength from that of the light from the first light source;
5) an image capturing device for capturing an image of the electronic component; and
6) at least one of a) a first light reflector mounted on the mounting head comprising, a first illuminating body which illuminates by absorbing the light from the first light source, and a first selectively transmitting body mounted adjacent to the first illuminating body, which transmits the light from the first light source and absorb the light from the second light source; and
b) a second light reflector mounted on the nozzle comprising, a transparent body transmitting the light from both the first light source and the second light source, a second illuminating body mounted adjacent to the transparent body, which illuminates by absorbing the light from the first light source, and a second selectively transmitting body mounted adjacent to the second illuminating body and on the opposite side from the transparent body, which transmits the light from the first light source and absorbs the light from the second light source.

An electronic component recognition device of the electronic component mounting apparatus of the present invention recognizes an image of the electronic component through the following steps,
a) lighting the electronic component being held by the nozzle provided to the mounting head by lighting means, and
b) capturing an image by the image capturing device.

The lighting means comprise the following elements;
a) the first and second light sources radiating light of different wavelengths,
b) the first light reflector mounted on the bottom face of the mounting head, and/or
c) the second light reflector mounted on the nozzle.

The first light reflector comprises the following elements;
a) the illuminating body which illuminates by absorbing the light from the first light source, and
b) the selectively transmitting body mounted on the surface of the illuminating body, which transmits the light from the first light source and absorbs the light from the second light source.

The second light reflector is defined by the following elements;
a) the transparent body which transmits light,
b) the illuminating body mounted on the surface of the transparent body, which illuminates by absorbing the light from the first light source, and
c) the selectively transmitting body mounted on the surface of the illuminating body, which transmits the light from the first light source and absorbs the light from the second light source.

The method of recognizing the electronic component of the electronic component mounting apparatus of the present invention, recognizes an image of the electronic component by steps of:
a) illuminating the electronic component being held by the nozzle provided to the mounting head by the lighting means, and
b) capturing an image of the electronic component by the image capturing device.

In the electronic component recognition method, illumination provided by reflection and transillumination for gaining an image showing the electronic component as a light image and a dark image respectively, can be switched. This switching is conducted by selecting the wavelength of the light radiated to:
a) the first light reflector which is mounted on the bottom face of the mounting head, comprising; the illuminating body which illuminates by absorbing the light from the first light source, and the selectively transmitting body mounted on the surface of the illuminating body, which transmits the light from the first light source and absorbs the light from the second light source; and/or b) the second light reflector which is mounted on the nozzle, comprising; the transparent body which transmits light, the illuminating body mounted on the surface of the transparent body, which illuminates by absorbing the light from the first light source, and the selectively transmitting body mounted on the surface of the illuminating body, which transmits the light from the first light source and absorbs the light from the second light source.

The first light reflector to be mounted on the mounting head, is of the electronic component mounting apparatus of the present invention, which illuminates the electronic component being held by the nozzle provided to the mounting head, by the first and second light sources radiating the light of different wavelengths. The first light reflector is defined by; a) the illuminating body which illuminates by absorbing the light from the first light source, and b) the selectively transmitting body mounted on the surface of the illuminating body, which transmits the light from the first light source and absorbs the light from the second light source.

A fixing method for a light reflector of the present invention is for fixing the second light reflector which illuminates the electronic component by using the light radiated from a light source, to the nozzle which sucks up the electronic component. The fixing method comprises the following steps;

a) providing a cone-shaped section to the nozzle, b) inserting the cone-shaped section into a fitting section, which is provided to the second light reflector in such a manner that its dimension is smaller than dimension of the cone-shaped section, and c) allowing the second light reflector to squeeze the nozzle in axial and radial directions.

As has been described, according to the present invention, the light reflectors illuminating the electronic component by the light from the light sources are defined by;

a) the illuminating body which illuminates by absorbing light from the first light source, and b) the selectively transmitting body mounted on the surface of the illuminating body, which transmits the light from the first light source and absorbs the light from the second light source. With this construction, the amount of the light entering a camera from the light reflectors can become even. Moreover, two lighting methods, i.e. transillumination and illumination provided by reflection can be selectively used by switching the wavelength of light by selecting the first light source or second light source.

According to the present invention, the fitting section for fixing the second light reflect to the nozzle, is designed so that the second light reflector can squeeze the nozzle in axial and radial directions when they are fixed to each other. This design of the fitting section enables the second light reflector to be strongly mounted, perpendicular to the nozzle.

DESCRIPTION OF THE PREFERRED EMBODIMENT

A preferred embodiment of the present invention is described hereinafter with reference to the drawings.

Figure 1:
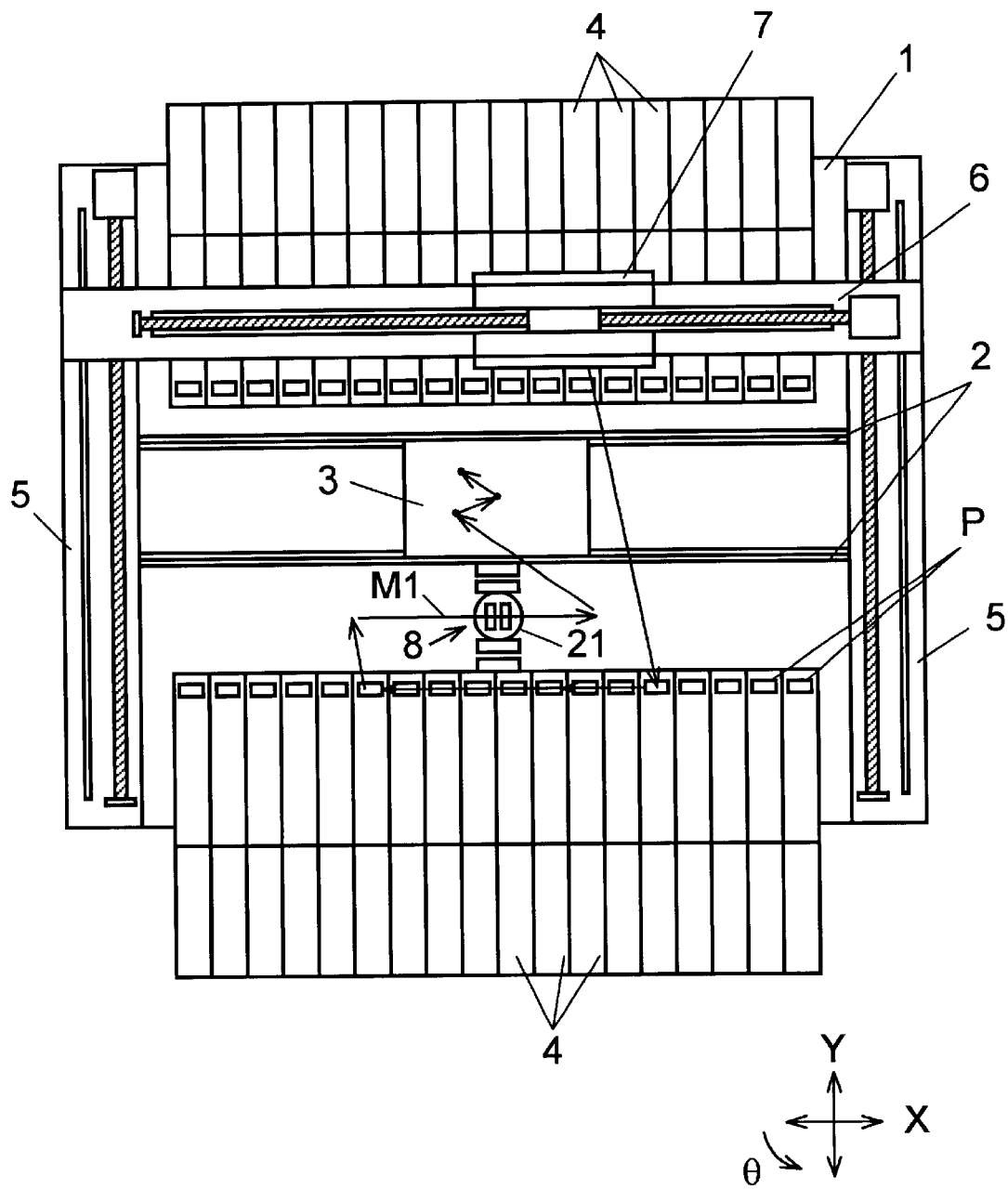
FIG. 1 shows a plan view of an electronic component mounting apparatus according to a preferred embodiment of the present invention.

The construction of the electronic component mounting apparatus is described with reference to FIG. 1. In FIG. 1, a conveyor 2 is provided on the center of a base 1 in the X direction (indicated as an arrow in FIG. 1). The conveyor 2 carries a substrate 3 and conducts positioning. As such, the conveyor 2 functions as a section where the position of the substrate 3 is determined. A number of components feeders 4 are provided along both sides of the conveyor 2. The components feeders 4 are loaded with electronic components P, and supply them.

A mounting head 7 mounting the electronic components P is provided on an X axis table 6. The X axis table 6 bridges two Y axis tables 5 disposed on both right and left sides of the base 1. This construction, by driving the X axis table 6 and the Y axis tables 5, enables the mounting head 7 to move horizontally, pick up the electronic components P from the components feeders 4 and mount them on the substrate 3. An electronic component recognition device 8 for the electronic components P, which recognizes the electronic components P, is disposed on the moving route of the mounting head 7.

Figure 2:
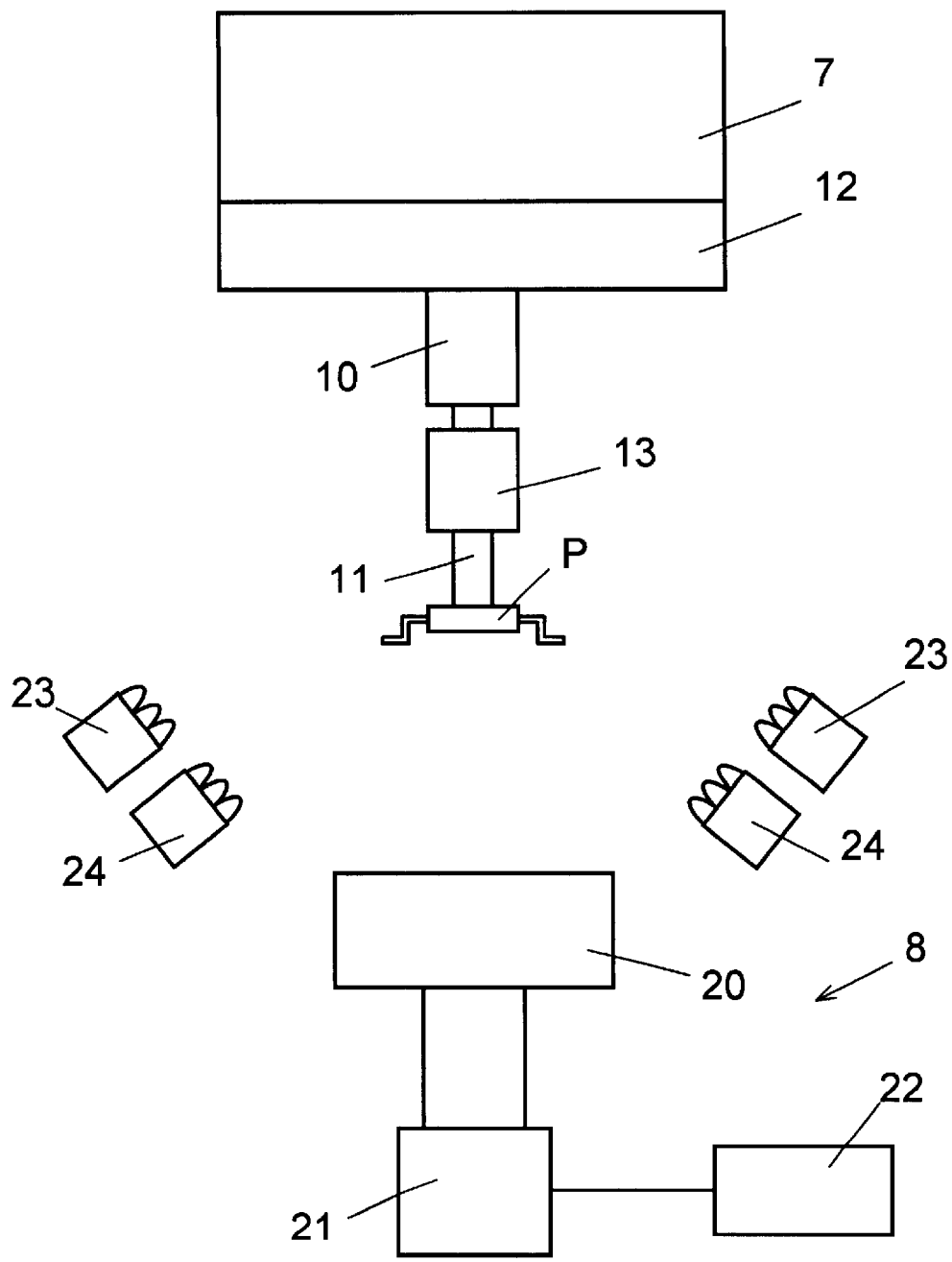
FIG. 2 shows a sectional view of an electronic component recognition device according to the preferred embodiment of the present invention.

The mounting head 7 and the electronic component recognition device 8 are described below, with reference to FIG. 2. In FIG. 2, a plurality of θ axes 10 (just one of them is illustrated in FIG. 2) are provided on the mounting head 7. A nozzle 11, which picks up the electronic components P by way of a vacuum chucking, is mounted on the θ axis 10. The θ axis 10 and the nozzle 11 are moved upwards and downwards together by vertical movement means (not illustrated). The electronic component which has been picked up by way of a vacuum chucking by the nozzle 11 on the θ axis 10 is rotated toward the θ direction (as indicated by an arrow in FIG. 1). A light reflector 12 functioning as a first light reflector is disposed on the top end of the nozzle 11. The light reflector 12 is located behind the electronic component P while the electronic component P is being held by the nozzle 11. A cylindrical light reflector 13 functioning as a second light reflector is also mounted on the nozzle 11, and is located behind the electronic component P.

The electronic component recognition device 8 has a lens 20 and a camera 21 provided thereon. The camera 21 is coupled with an image processing section 22. The image processing section 22 processes the image data of the electronic component P recognized by the camera 21 to detect the deviations in alignment of the electronic component P in relation to the correct mounting position. Above the surrounding area of the lens 20 is a light source section. The light source section includes a first light source 23 of an infrared-emitting diode (infrared LED), which radiates infrared light of about 850 nm in wavelength. The light source section further includes a second light source 24 of a red light emitting diode (red LED), which radiates red light of about 690 nm in wavelength. The first and second light sources 23 and 24 are placed in such a manner that each of them radiates light diagonally from below to the light reflectors 12 and 13 located above the electronic component recognition device 8.

Figure 3:
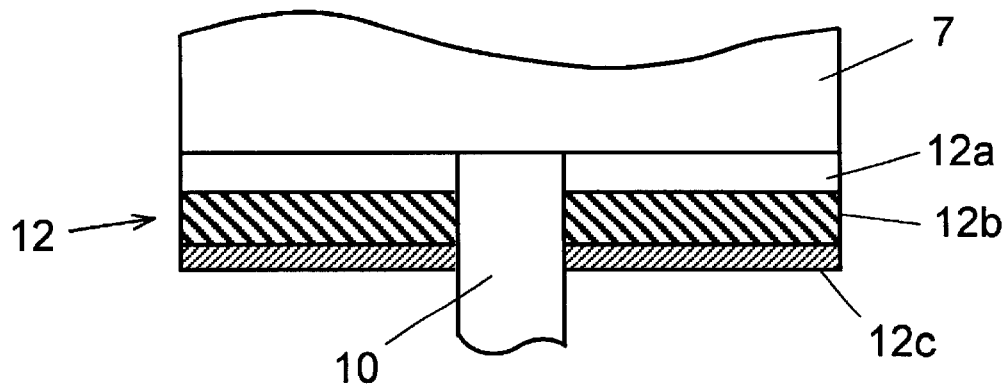
FIG. 3 shows a sectional view of a light reflector to be mounted on a mounting head of the electronic component recognition device according to the preferred embodiment of the present invention.

The light reflector 12 is described below with reference to FIG. 3. As FIG. 3 illustrates the light reflector 12 has a three-layered structure. The light reflector 12 comprises a reflector 12a which totally reflects the light. Mounted on the surface of the reflector 12a is an illuminating body 12b which illuminates by absorbing the light from the first light source 23. The illuminating body 12b has a selectively transmitting body 12c disposed on the bottom surface thereof, which transmits the light from the predetermined light source and absorbs the light from the second light source 24.

The reflector 12a consists of mirror-finished metal such as stainless steel. The illuminating body 12b consists of such material as AS (acrylonitrile styrene) resin having characteristics of light absorption rate and light diffusion rate being almost 1. The light illuminating body 12b illuminates by absorbing the light from the first light source 23. In this embodiment, the selectively transmitting body 12c uses an infrared transmitting filter made of an acrylic resin and the like. With the above-mentioned construction, when light is radiated from the first light source 23 to the light reflector 12, the selectively transmitting body 12c transmits the infrared light from the first light source 23. Therefore, the transmitted light is absorbed by the illuminating body 12b. The light which has passed through the illuminating body 12b and reaches the reflector 12a is reflected on the surface thereof, so that the light is eventually absorbed by the illuminating body 12b. The illuminating body 12b absorbs the light energy of the light, gets excited in terms of energy and radiates light of its proper color. The light radiated in the way described above, is different from normal reflected light, as it is free from unevenness caused by uneven reflection. Therefore, very even light is radiated toward under the light reflector 12.

Figure 4:
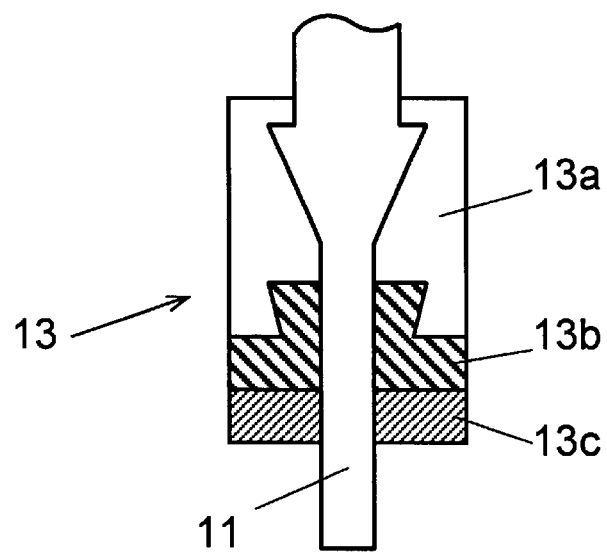
FIG. 4 shows a sectional view of a light reflector to be mounted on a nozzle of the electronic component recognition device according to the preferred embodiment of the present invention.

The light reflector 13 is described below with reference to FIG. 4. The light reflector 13 also has a three-layered construction. The top layer is a transparent body 13a which transmits the reflected light from the surrounding area. The middle layer is a illuminating body 13b disposed on the surface of the transparent body 13a, which illuminates by absorbing light from a predetermined light source. The bottom layer is a selectively transmitting body 13c disposed on the surface of the illuminating body 13b, which transmits the light from a predetermined light source, and absorbs light from another predetermined light source. The transparent body 13a consists of a transparent resin such as polyacetal resin. The transparent body 13a transmits the reflected light radiated from a light source located below and reflected from the mounting head 7 located above and other metal components. Thereby, the transparent body 13a allows the illuminating body 13b mounted below to absorb the largest possible amount of light.

The illuminating body 13b and the selectively transmitting body 13c, each consists of the same material and has the same function as the illuminating body 12b and selectively transmitting body 12c of the light reflector 12 respectively. The layers comprising the light reflectors 12 and 13 are joined together without adhesives. For example, as illustrated in FIG. 4, the joining surfaces of the transparent body 13a and the illuminating body 13b are rever-seundercut shaped which joins them to each other. The illuminating body 13b and the selectively transmitting body 13c are joined by the coinjection molding method.

Figure 5A:
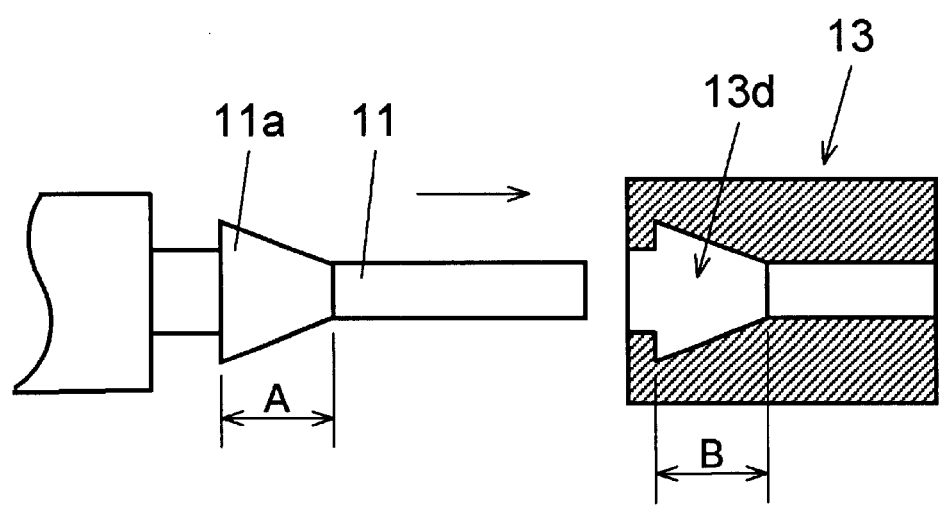
FIGS. 5A and 5B show a fixing method of the light reflectors according to the preferred embodiment of the present invention.
Figure 5B:
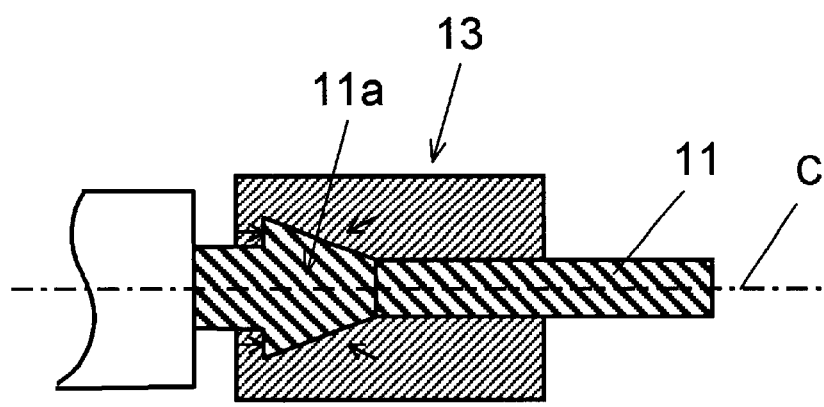

Following is a description of the fixing method of the nozzle 11 and the light reflector 13, given with reference to FIGS. 5A and 5B. In FIG. 5A, a cone-shaped section 11a is provided on the nozzle 11. The light reflector 13 has a fitting section 13d fitting the shape of the cone-shaped section 11a. A size B in the lengthwise direction of the fitting section 13d is designed to be slightly shorter than a size A in the lengthwise direction of the cone-shaped section 11a. As illustrated in FIG. 5B, the cone-shaped section 11a of the nozzle 11 is squeezed or compressed by the light reflector 13 in axial and radial directions when the nozzle 11 is fitted to the light reflector 13. Therefore, the light reflector 13 remains symmetrical about a center axis C of the nozzle 11, and is accurately and tightly fixed to the nozzle 11.

Figure 6:
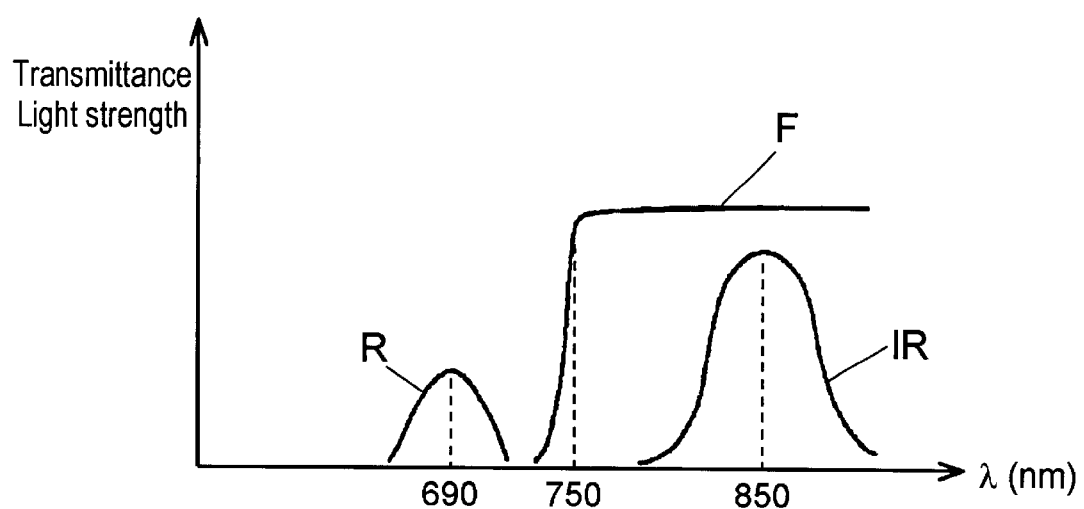
FIG. 6 is a chart showing transmission characteristics of the light reflectors and light-intensity characteristics of light sources of the electronic component recognition device according to the preferred embodiment of the present invention.

The transmittance characteristics of the infrared transmitting filter used for the selective transmission bodies 12c and 13c is described hereinafter with reference to FIG. 6. Also described below are the light intensity characteristics of an infrared LED used for the first light source 23 and a red LED for the second light source 24. The horizontal axis of FIG. 6 shows the wavelength of light. The vertical axis shows the transmittance for a graph F indicating the characteristics of the infrared transmitting filter. The vertical axis shows light intensity for a graph IR and a graph R indicating the characteristics of the infrared LED and the red LED respectively. As FIG. 6 shows, peaks of the light intensity are around 690 nm and 850 nm in the case of the red LED and the infrared LED respectively. The infrared transmitting filter has a transmittance characteristics in which the transmittance declines precipitously when the wavelength of light becomes 750 nm or less, as the graph F indicates.

Figure 7:
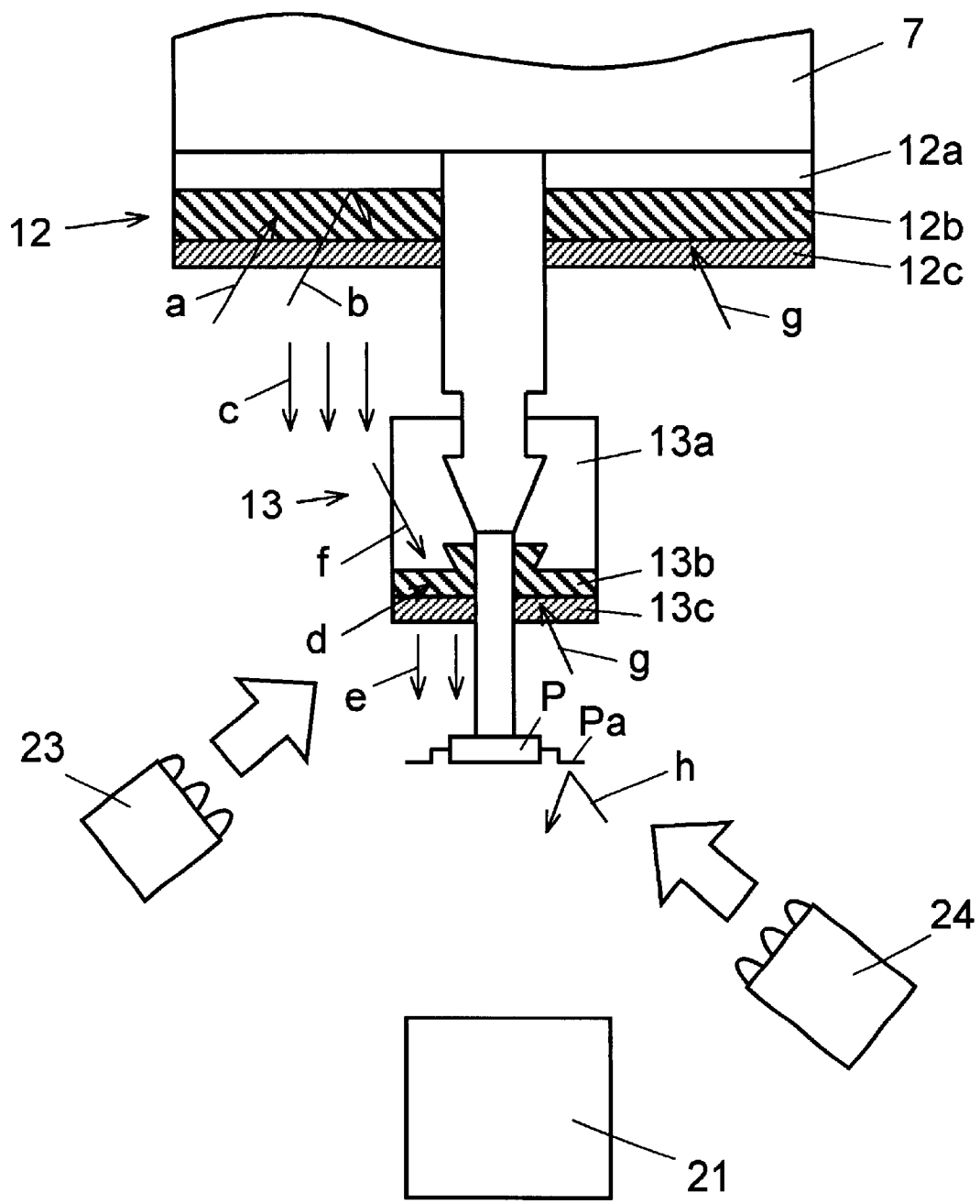
FIG. 7 shows a partially sectional view of the electronic component recognition device according to the preferred embodiment of the present invention.

Next, a lighting method using the above-mentioned light sources and the light reflectors 12 and 13 is described with reference to FIG. 7. In FIG. 7, when the infrared LED of the first light source 23 is lit, the radiated infrared light (an arrow a) passes through the selectively transmitting body 12c and is absorbed by the illuminating body 12b. The light passed through the illuminating body 12b is reflected by the reflector 12a, so that the light is eventually absorbed by the illuminating body 12b (an arrow b). The illuminating body 12b gets excited by the absorbed light energy and radiates light of its proper color. This light is reflected downwardly by the reflector 12a ( arrows c) and received by the camera 21. In this process, when the reflected light passes through the section where the electronic component P exists, the reflected light is obstructed by the electronic component P. Therefore, the camera 21 gets an image in which the electronic component P appears as a dark image and surrounding area as a light image.

As FIG. 7 shows, in the case of the light reflector 13, the infrared light (an arrow d) passes through the selectively transmitting body 13c and gets absorbed by the illuminating body 13b. Thereby, the illuminating body 13b radiates its proper light in the same manner as the illuminating body 12b (arrows e). The light reflector 13 has the transparent body 13a disposed on the top of the illuminating body 13b. Therefore, the light reflected downwardly from the surrounding area, from for example, the metal components of the mounting head 7, transmits through the transparent body 13a and gets absorbed by the illuminating body 13b (an arrow f). As such, the light radiated from the light sources is absorbed without any loss, enabling efficient lighting.

As FIG. 7 also shows, when the red LED of the second light source 24 is lit, the radiated red light (an arrow g) hardly transmits through the selective transmission bodies 12c and 13c. Therefore, the light reflectors 12 and 13 do not reflect emitted red light downwardly. In this case, among the red light radiated to the electronic component P, only the light entering the bottom face of a lead Pa of the electronic component P is reflected downwardly (an arrow h) and enters the camera 21. The contrast between this light and other diffused reflected light from other areas is significant. Therefore, the camera 21 gains an image in which the lead Pa of the electronic component P appears as a light image while other area appears as a dark image.

As has been described, a plurality of light sources radiating light of different wavelengths are provided. The selective transmission bodies 12c and 13c employed in the light reflectors 12 and 13 respectively, selectively transmit the light of predetermined wavelengths. With this construction, selecting the wavelength of the light projected to the light reflectors 12 and 13 allows switching between the illumination provided by reflection and the transillumination in order to gain an image with the electronic component P appearing as a light image and a dark image respectively.

Following is an electronic component mounting method. In FIG. 1, the mounting head 7 moves to above the electronic components P in the component feeder 4. The nozzle 11 picks up an electronic component P by way of a vacuum chucking. The mounting head 7 holding the electronic component P at the bottom tip of the nozzle 11 moves along on the route M1. When the mounting head 7 passes through over the electronic component recognition device 8, the electronic component P is recognized by the camera 21.

Figure 8A:
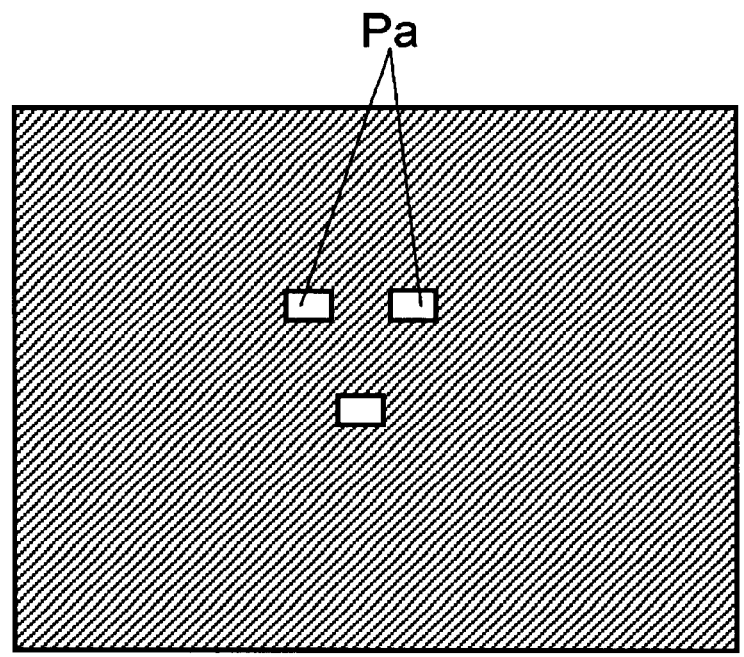
FIG. 8A shows an image captured by the electronic component recognition device according to the preferred embodiment of the present invention.
Figure 8B:
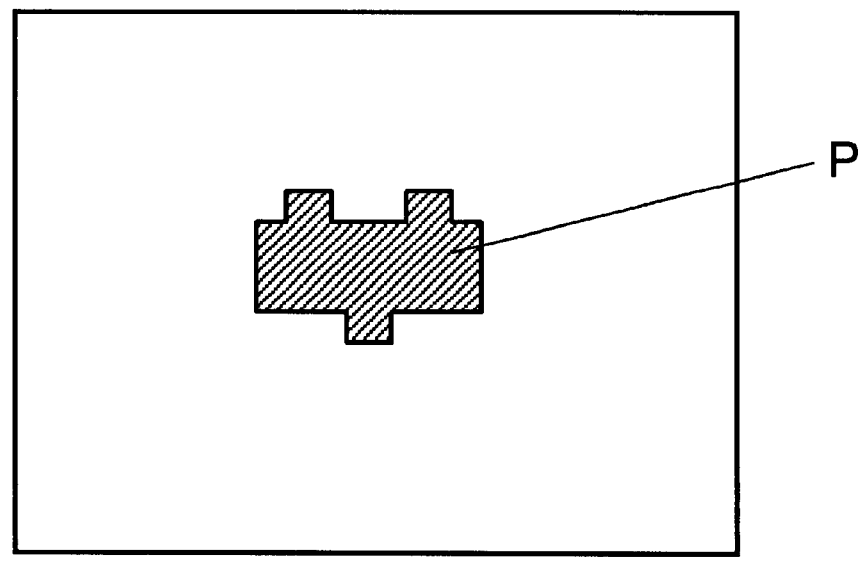
FIG. 8B shows an image captured by the electronic component recognition device according to the preferred embodiment of the present invention.

At this moment, the kind of the image of the electronic component P recognized by the camera 21 is switched according to the kind of the electronic component to be mounted. For example, when there is a portion such as the metallic lead Pa which reflects light very well, on the bottom face of the electronic component P, the portion can be rightly used as a criterion for location recognition. In such a case, the second light source 24 of the electronic component recognition device 8 is lit. Then, the camera 21 gains an image with the lead Pa of the electronic component P appearing as a light image produced by the illumination provided by reflection as shown in FIG. 8A. Conversely, when there is not enough area which reflects light very well on the bottom face of the electronic component, the first light source 23 is lit. In this case, the camera 21 gains an image with the whole body of the electronic component P appearing as a dark image, by the transillumination as shown in FIG. 8B.

Next, based on those images, the image processing section 22 detects deviations in alignment of the electronic component P in relation to the correct mounting position, that is, the misalignment in X direction, Y direction and 0 direction (indicated as an arrow in FIG. 1). The misalignment then, is corrected by the correcting operation of the mounting head 7. The electronic component P is mounted on the correct position on the substrate 3 in correct angles.

When the electronic component P is small, it is illuminated by the light reflector 13 mounted on the nozzle I1. Conversely, when the electronic component P is large, it is illuminated by the light reflector 12 mounted over the bottom face of the mounting head 7. In both cases, the light is not reflected directly. In other words, the light is absorbed by the illuminating body which gets excited by the absorbed energy. Due to this, the electronic component P is illuminated evenly and efficiently regardless of the incidence directions of the light, thereby improving the accuracy in recognition.

According to the present invention, the light reflectors reflecting the light from the light sources comprise an illuminating body which illuminates by absorbing the light from the first light source, and a selectively transmitting body mounted on the surface of the illuminating body, which transmits the light from the first light source and absorbs the light from the second light source. This construction allows the light entering the camera from the light reflectors to be even. Furthermore, by switching the wavelength of the light by selecting the first or the second light sources, two illuminating methods, the transillumination and the illumination provided by reflection can be selectively used. The fitting section of the second light reflector which fits to the nozzle is designed so that the second light reflector can squeeze the nozzle in axial and radial directions when they are fixed to each other. Due to this, the second light reflector is strongly joined, perpendicularly to the nozzle.

What is claimed is:

1. A method of recognizing an electronic component in which image recognition of an electronic component is conducted by illuminating and reading an image of the electronic component held by a nozzle disposed on a mounting head by lighting means and by an image pickup device, said method comprising the steps of:
   a) illuminating the electronic component held by said nozzle disposed on the mounting head; and
   b) capturing an image of the electronic component by the image pickup device and recognizing the image of the electronic component;
   c) switching between reflection illumination for acquiring an image with the electronic component appearing as a light image and transillumination illumination for acquiring an image with the electronic component appearing as a dark image, by selecting the wavelength of light projected to:
      i) a first light reflector disposed on the mounting head and including an illuminating body which illuminates by absorbing light from a first light source, and a selectively transmitting body disposed on the illuminating body, which transmits light from said first light source and absorbs light from a second light source; and
      ii) a second light reflector disposed on said nozzle and including a transparent body which transmits light, an illuminating body disposed on the transparent body, which illuminates by absorbing light from said first light source, and a selectively transmitting body disposed on the illuminating body, which transmits light from said first light source and absorbs light from said second light source.

2. The method of recognizing an electronic component as defamed in claim 1, wherein said method further comprising the step of switching the reflection illumination and the transillumination illumination responding to types of electronic components to be mounted.

3. The method of recognizing an electronic component as defined in claim 1, wherein said method further comprising the step of illuminating the electronic component by said first light reflector when the electronic component to be mounted is larger than said second light reflector.

* * * * *